United States Patent [19]

Ngo et al.

[11] Patent Number: 4,906,552
[45] Date of Patent: Mar. 6, 1990

[54] TWO LAYER DYE PHOTORESIST PROCESS FOR SUB-HALF MICROMETER RESOLUTION PHOTOLITHOGRAPHY

[75] Inventors: Catherine M. Ngo, Woodland Hills; Leroy H. Hackett, Torrance, both of Calif.

[73] Assignee: Hughes Aircraft Company, Los Angeles, Calif.

[21] Appl. No.: 158,427

[22] Filed: Feb. 22, 1988

[51] Int. Cl.$^4$ ............................................... G03C 5/16
[52] U.S. Cl. .................................. 430/312; 430/156; 430/315; 430/330; 430/394
[58] Field of Search ............... 430/312, 394, 328, 330, 430/156, 329, 326, 313, 315

[56] References Cited

U.S. PATENT DOCUMENTS 4,362,809 12/1982 Chen et al. ........................... 430/312
4,668,606 5/1987 DoMinh et al. ..................... 430/271

OTHER PUBLICATIONS

Lin et al., "Practicing the Novolac Deep-UV Portable Conformable Masking Technique", J. Vac. Sci. Tech. No. 19(4), Nov./Dec. 1981, pp. 1313-1319.

*Primary Examiner*—Jose Dees
*Attorney, Agent, or Firm*—P. M. Coble; W. K. Denson-Low

[57] ABSTRACT

Well-defined metal lines of 0.5 micrometers and less in width are produced on a substrate by photolithography, using a two layer photoresist process. The first resist layer, adjacent the substrate, is poly(methylmethacrylate) from about 0.5 to about 1 micrometer thick, having a sufficient amount of an ultraviolet absorbing dye to prevent positive interference of light reflected from the surface of the substrate during exposure. The second resist layer is a polymer of naphthoquinone diazide, in a thickness of about 0.5 to about 1.1 micrometers. To achieve 0.5 micrometer resolution of the metal line, the total thickness of the two resist layers is about 1.5 micrometers; to achieve less than 0.5 micrometer resolution, the total thickness of the two resist layers is about 1.0 micrometer.

6 Claims, 1 Drawing Sheet

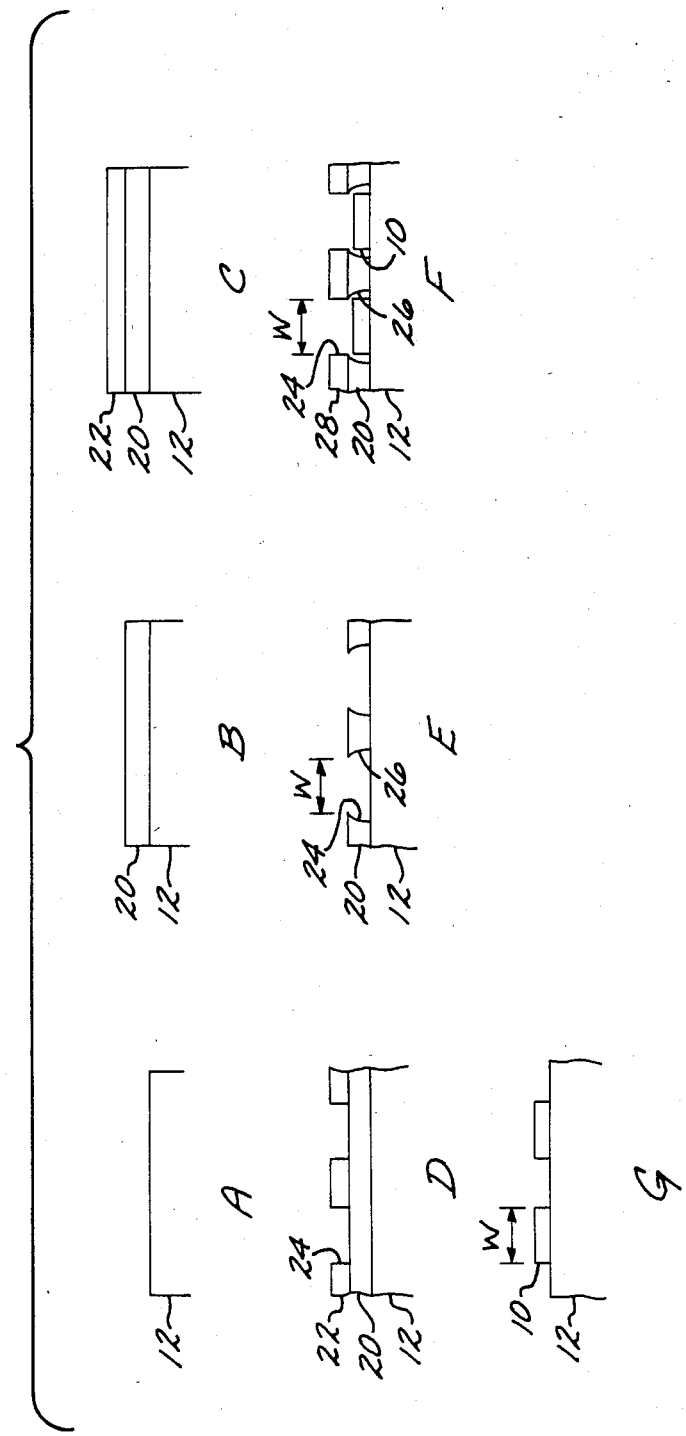

४,906,552

TWO LAYER DYE PHOTORESIST PROCESS FOR SUB-HALF MICROMETER RESOLUTION PHOTOLITHOGRAPHY

BACKGROUND OF THE INVENTION

This invention relates to photolithography, and, more particularly to a process for depositing, upon substrates, lines of a width of 0.5 micrometers or less.

Integrated circuits are arrays of microelectronic devices whose sizes are very small. In a typical integrated circuit, hundreds or even thousands of devices such as transistors, resistors, capacitors, etc. are deposited upon a single substrate and interlinked so as to perform selected functions. Integrated circuits are used in a wide variety of consumer, industrial, and military electronics. Their small size, with possibly thousands of individual devices in an area of one square inch, provides enormous computing power in a small, lightweight unit. The small size also reduces the power consumption and increases the operating and computing speed of the unit. Microelectronics and integrated circuits make possible the microcomputer and many other electronic advances.

Since the integrated circuit was first discovered, there has been a continuing search for methods to fabricated the circuits in ever smaller sizes. Reductions in size translate to increased operating speed, as well as greater computing power in a small area.

The conventional approach to fabricating integrated is in a layered configuration. Successive layers of metals, insulators, and semiconductors are deposited upon a substrate in carefully selected patterns to form devices, interlinked by metallic conductor paths to form arrays and, ultimately, the integrated circuit. Since the integrated circuit was first discovered, there has been a continuing search for methods to manufacture the circuit in ever-smaller sizes.

At the present time, most integrated circuits are fabricated by photolithography, which utilizes photoreduction together with sophisticated masking procedures to create particular configurations of the layers. In a typical photolithographic procedure, a layer of a photoresist material is deposited over a semiconductor layer. A solid mask having openings therethrough is placed over the photoresist layer. A portion of the photoresist layer is flood exposed through the openings in the mask using visible or ultraviolet light, causing a chemical change in the photoresist material. The photoresist material is then removed in the exposed regions (positive photoresist), leaving a pattern of semiconductor regions that are exposed and a corresponding pattern that is protected by the remaining photoresist material. With the semiconductor so patterned, the exposed regions can be removed by etching, or new material can be deposited into the exposed regions, as may be required. These procedures are then repeated as many times as necessary to build up a circuit with many devices thereon. In the course of fabricating a moderately complex integrated circuit, there may be dozens of such masking, patterning, and etching or depositing procedures. Manufacturing machines to perform these functions on a semi-automated basis are widely available in the microelectronics industry.

The ability to reduce the size of features in microelectronic devices is limited by the resolution that can be attained with these techniques. As the photographic reductions are increased, the features in the pattern become fuzzy and irregular in form, due to a combination of limitations in the deposition procedure and optical interference effects. Existing mass production patterning techniques are limited by a minimum resolution of several micrometers. (One micrometer is about 1/25 of one thousandth of an inch.) Advanced techniques under research allow minimum resolutions of about 0.8 mirometer. There are no optical projection techniques for attaining resolutions of 0.5 micrometers or less.

Resolutions below 0.5 micrometers can presently be attained by other approaches, such as electron beam patterning. Instead of using a mask and flood illumination of a resist layer with light, the pattern is written directly onto the surface of the resist by an electron beam operated under computer control to form the pattern. This approach requires that the features of the layer be patterned sequentially, one after the other, and is termed a "step and repeat" technique. It requires more costly and complex apparatus than now used.

By contrast, the approach described previously is a "flood illumination" technique, wherein all of the features are exposed simultaneously through the mask. The exposure is conventionally performed with a 10× stepper, which achieves high quality images by using a mask that is 10 times the size of the final image and reduction optics, and by precisely aligning, focusing, and exposing the pattern repeatedly over the wafer. The stepped flood illumination approach is generally preferred because of its greater speed and lower cost, but the electron beam approach must currently be used to attain feature resolutions of less than 0.5 micrometers.

There exists a need for a stepped flood illumination patterning technique that achieves resolutions of 0.5 micrometers and less through the use of ultraviolet light. Such a technique would permit significantly higher device packing densities and higher integrated circuit operating speeds than presently possible. Ideally, such a technique would utilize the same apparatus as now used for achieving resolutions of 1 micrometer and greater, so that the speed and cost advantages of existing stepped flood illumination procedures could be realized, without the need for new equipment investment. The present invention fulfills this need, and further provides related advantages.

SUMMARY OF THE INVENTION

The present invention resides in a process for patterning substrates to permit greater resolution of features in photolithography. Deposition of features having resolutions of 0.4–0.5 micrometers has been demonstrated, using conventional patterning apparatus and ultraviolet light. The process is otherwise compatible with conventional microelectronic procedures, so that the greater resolutions can be achieved without major new investments in equipment.

In accordance with the invention, a process for patterning a substrate comprises the steps of spin coating a first resist layer onto the substrate, the first resist layer comprising a solution of from about 6 to about 9 percent of poly(methylmethacrylate) and a dye having an absorbance of at least about $1.2 \times 10^5 L$ at 436 nanometers light wavelength, the dye being present in a ratio of about 1 part dye to 4 parts poly(methylmethacrylate), by volume; baking the first resist layer, the amount of material deposited in the step of spin coating a first resist layer being sufficient that the thickness of the first resist layer after baking is from about 0.5 micrometers for about 6 percent poly(methylmethacrylate) to about 1.1 micrometers for about 9 percent poly(methylmethacrylate); spin coating a second resist layer overlying the first resist layer, the second resist layer being a positive photoresist material including a naphthoquinone diazide; baking the second resist layer, the amount of the material added in the step of spin coating a second resist layer being sufficient that the thickness of the second resist layer after baking is from about 0.4 to about 0.5 micrometers; exposing a pattern on the second resist layer with ultraviolet light having a wavelength of greater than about 300 nanometers, and developing the pattern to form an opening through the second resist layer; and exposing a pattern on the first resist layer with ultraviolet light having a wavelength of less than about 300 nanometers, through the opening in the second resist layer, removing the second resist layer, and developing the pattern to form an opening through the first resist layer, the width of the opening in the first layer being no greater than about 0.5 micrometers.

More generally, a process for patterning a substrate comprises the steps of depositing a first resist layer onto the substrate, the first resist layer comprising a solution of a photoresist material and a sufficient amount of a dye to prevent reflective positive interference of ultraviolet light having a first resist layer exposure wavelength; baking the first resist layer; depositing a second resist layer overlying the first resist layer; baking the second resist layer; exposing a pattern on the second resist layer with ultraviolet light having a second resist layer exposure wavelength different from the first resist layer exposure wavelength, and developing the pattern to form an opening through the second resist layer; and exposing a pattern on the first resist layer with ultraviolet light having the first resist layer exposure wavelength, and developing the pattern to form an opening through the first resist layer.

The process of the invention is particularly well suited for depositing metal stripes whose width is 0.5 micrometers or less, typically 0.4–0.5 micrometers, by the metal lift off technique. After the substrate is patterned, as described above, metal is deposited over the patterned substrate, with some of the metal being deposited into the exposed portion of the pattern and some of the metal overlying the remaining first resist layer. After deposition, the remaining first resist layer is dissolved, removing the portion of the metal that is deposited upon the resist layer but leaving that portion of the metal deposited into the opening in the resist layer. The resulting metal stripe has a width of no greater than 0.5 micrometers, and is well shaped and formed, without rough or irregular edges.

It will now be appreciated that the approach of the present invention yields an important advance in the microelectronic art. A substrate can be readily patterned by a flood illumination technique to permit formation of metal features of less than 0.5 micrometers. Other features and advantages of the invention will be apparent from the following more detailed description, taken in conjunction with the accompanying drawings, which illustrate, by way of example, the principles of the invention.

BRIEF DESCRIPTION OF THE DRAWINGS

FIG. 1 is a side elevational view of a substrate having a metal stripe deposited thereupon;

FIG. 2 is a side elevational view of a second substrate having a metal stripe deposited thereupon; and FIG. 3 is a pictorial flow chart of the process of the preferred embodiment, illustrating the configuration at each step of the process.

DETAILED DESCRIPTION OF THE PREFERRED EMBODIMENT

In its preferred form, the present invention is embodied in a process to pattern a substrate and then deposit a metal stripe onto the patterned substrate, to produce structures of the form illustrated in FIGS. 1 and 2. Referring to FIG. 1, a metal stripe 10 is deposited upon a substrate 12. The width W of the stripe 10 is 0.5 micrometers or less, typically 0.4–0.5 micrometers. The height H of the strip is typically about 0.5 micrometers, but can be adjusted by the amount of metal deposited. The side 14 of the stripe are generally smooth and regular. A similar structure shown in FIG. 2, except that the substrate 12 is composed of a base 16 and a semiconductor layer 18. That is, the term "substrate" is generally used herein to mean a structure previously present, which is patterned by the process of the invention. In fact, it may have many prior layers and configured regions, so that the pattern and metallization of the present approach are deposited overlying the previously present structure. The present invention is not limited to patterning and metallizing a semiconductor or insulator base.

The present invention has two presently preferred embodiments, a first preferred embodiment for depositing metal stripes having a width of about 0.5 micrometers or larger, and a second preferred embodiment for depositing metal stripes having a width of less than about 0.5 micrometers, and typically 0.4–0.5 micrometers in width. Both embodiments utilize the same series of patterning and deposition steps, the differences being in the compositions and thicknesses of resist layers, and the procedures for exposing and developing of the layers. The entire process will first be described for the first preferred embodiment, and then the differences for the second preferred embodiment will be described.

The process of the first preferred embodiment is illustrated in FIG. 3. A substrate 12 is furnished, FIG. 3A. The substrate 12 can be a piece of ceramic such as silicon dioxide, a piece of semiconductor such as gallium arsenide, or a composite structure having a previously deposited array of ceramics, semiconductors, and metals.

A first resist layer 20 is deposited overlying the substrate 12. The first resist layer 20 has a thickness of about 1.1 micrometers. The first resist layer 20 is prepared by dissolving about 9 percent by volume of poly(methylmethacrylate) and about 2.22 percent by volume of a dye into the solvent chlorobenzene. About 2 milliliters of this solution is dispensed onto the substrate and spun at 3500 revolutions per minute (rpm) for five seconds. The resulting coated substrate is baked at 180° C. for two minutes on a hot plate, or for 30 minutes in a convection oven, to produce a final resist layer 20 about 1.11 micrometers in thickness, FIG. 3B.

The dye used in the first resist layer 20 should have an absorbance of at least about 1.2 at a wavelength of 436 nanometers. Such a dye is available from Kodak as its dye D-418, which is preferred. The D-418 dye is in the form of yellow crystals, which readily dissolve in solvents such as chlorobenzene. The dye has excellent thermal stability. A 0.5 micrometer thick layer of poly(methylmethacrylate) can be baked at 200° C. in a convection oven without decomposition.

The dye is transparent to light at and below 360 millimeters wavelength, but it absorbs the reflection from the surface of a highly reflective substrate. This absorption property works well in combination with poly(methylmethacrylate), since the spectral sensitivity of this polymer is at 220 nanometers. The layer 20 containing poly(methylmethacrylate and this dye is exposed at a significantly lower light energy than possible with other dyes, such as Coumarin 6 dye. The Coumarin 6 dye is not transparent below 360 nanometers, so that the combination of poly(methylmethacrylate) and Coumarin 6 requires a high dose of light energy for exposure. The required high light dose makes it difficult to achieve resolutions below 0.75 micrometers.

A second resist layer 22 is deposited overlying the first resist layer 20. The second resist layer 22 preferably has a thickness of about 0.5 micrometers, most preferably 0.45–0.46 micrometers. The second resist layer 22 is formed of a positive photoresist material sensitive to longer wavelengths of ultraviolet light. It includes a naphthoquinone diazide, in an amount of 20 percent by volume in 2-ethoxyethyl acetate solvent, having a viscosity of about 5.4 cs at a temperature of 77° F. Such a photoresist is available from Kodak as its Micro Positive Resist 809, and the use of this photoresist is preferred. The solvent and developer system for this photoresist material do not interact with the first resist layer 20 during development.

To coat the substrate, which already has the first resist layer 20 thereupon, the solution of the second resist layer 22 is dispensed onto the surface and spun at 2900 rpm for 30 seconds. The substrate is then baked for 30 seconds at 100° C. on a hot plate or 30 minutes at 90° C. in a convection oven.

The resulting structure, FIG. 3C, is an unpatterned bi-layer photoresist.

Patterning is achieved in three steps of exposing and developing. The second resist layer 22 is first exposed through a mask and a reduction lens system, preferably with a conventional wafer exposure apparatus using the G ultraviolet line at 436 nanometers with an exposure dose of 350 millijoules. After exposure is complete, the substrate is baked for 30 seconds at 100° C. on a hot plate or 30 minutes at 90° C. in a convection oven. The exposed regions are transformed to indenecarboxylic acid by the light, while the unexposed regions remain as naphthoquinone diazide.

The exposed pattern in the second resist layer 22 is developed by placing the exposed substrate into an appropriate developer solution that dissolves and removes the exposed portion of the photoresist material (this being a positive photoresist). For the preferred Kodak 809 second resist layer 22, the preferred developer is Kodak Micro Positive Developer 809, which dissolves and removes the indenecarboxylic acid. This developer does not contain sodium hydroxide, but does contain sodium salts that are water soluble and are removed by rinsing after the developing is complete. The preferred developer solution is a mixture of 1 part by volume of the Kodak 809 developer to three parts of water. The substrate is placed into the developer solution for 1 minute and then rinsed in deionized water for 2 minutes. This procedure does not affect the first resist layer 20.

The resulting structure is illustrated in FIG. 3D. The second resist layer 22 has second resist layer openings 24 therethrough, corresponding to the pattern of the mask used to expose the second resist layer 22.

The first resist layer 20 is exposed through the openings 24 in the layer 22, which acts as a conforming mask, using deep ultraviolet flood exposure at 220 nanometers. This exposure is accomplished by exposing the substrate for 12 minutes at 15 milliwatts per square centimeter. At this point, the remaining second layer 22 is no longer required, and is removed by exposing it to light at 400 nanometers and placing it into the Kodak 809 developer to remove it. The first resist layer 22 is developed in a 100 percent concentration of methyl isobutyl ketone (MIBK) for 40 seconds. In the developing, the exposed portion of the first resist layer 22 is dissolved and removed, leaving a first resist layer opening 26 therethrough to the substrate 12. The substrate is then rinsed in isopropanol for 30 seconds, rinsed in water for two minutes, and blown dry with nitrogen gas.

The resulting structure is illustrated in FIG. 3E. The patterning is complete to the substrate 12, with the size of the opening 26 slightly larger than the size of the opening 24, due to optical diffraction effects in the exposure. The width W of the opening 24 is ideally about 0.5 micrometers. Patterning of the substrate in this first preferred embodiment is now complete.

The second preferred embodiment is used to achieve a width W of the opening 24 of less than about 0.5 micrometers, and typically about 0.4 micrometers. To practice the second preferred embodiment, generally the same procedure as illustrated in FIG. 3 and discussed above is followed, with the following exceptions. The composition of the first resist layer 22 is about 6 percent poly(methylmethacrylate) and about 1.5 percent dye. (The ratio of dye to poly(methylmethacrylate) is ¼ in both embodiments.). It is applied by spinning at 4000 rpm for 5 seconds to arrive at a thickness of about 0.5 micrometers, after baking as previously described. The second resist layer 22, and its method of application, are as previously described.

In the second perferred embodiment, the second resist layer 22 is exposed through a mask or pattern using ultraviolet light of the I line at 365 nanometers, for 1200 milliseconds. The second resist layer is then baked as described before. The second resist layer 22 is developed in two steps. The first is 30 seconds in a mixture of 1 part Kodak 809 developer in 1 part water; the second is 30 seconds in a mixture of 1 part Kodak 809 developer in three parts water, followed by rinsing for 2 minutes in deionized water.

The first resist layer 20 is exposed with deep ultraviolet light at 220 nanometers for 12 minutes at 15 milliwatts per square centimeter, as before, through the openings 24 that act as a conforming mask. As in the first preferred approach, the remaining material of the second layer 22 is flood exposed at 440 nanometers and removed by immersion in the Kodak 809 developer. The first resist layer 20 is developed for 40 seconds in a mixture of two parts of MIBK in 1 part of isopropanol. After developing, it is rinsed and dried, as previously described.

The final structure produced by the second preferred embodiment is similar to that of the first preferred embodiment, both of which are shown in FIG. 3E. The principal difference is that the width W produced by the second preferred embodiment is about 0.4 micrometers minimum, as compared with 0.5 micrometers minimum for the first preferred embodiment.

The preferred use of the patterning approaches just described is to deposit metallization stripes onto the substrate 12. In one approach, a metal such as tungsten, titanium-gold, nickel-gold, titanium, or gold is deposited from a vapor deposition source downwardly onto the surface of the structure illustrated in FIG. 3E, to produce the structure illustrated in FIG. 3F. A portion 28 of the metal is deposited onto the top of the remaining portion of the first resist layer 20, while a second portion of the metal is deposited onto the substrate 12 through the opening 24, to form the stripe 10. The stripe 12 has a width corresponding to that of the opening 24.

The portion 28 of the metal, as well as the remaining resist layer 20, is removed by placing the structure of FIG. 3F into the solvent acetone or a photoresist stripper for 10 minutes, leaving the stripe 10 deposited upon the substrate 12, FIG. 3G and FIG. 1.

The process of the invention has been practiced successfully using the first preferred embodiment, described above, to produce tungsten or titanium-gold stripes of a width of 0.5 micrometers. It has also been practiced successfully using the second preferred embodiment, described above, to produce tungsten or titanium-gold stripes of a width of 0.4 micrometers.

It will be appreciated that the present invention provides an important advance in the art of photolithography. It permits the patterning and formation of features in the size range 0.4–0.5 micrometers, by stepped reduction techniques, rather than electron beam step and repeat techniques. Standard production techniques and apparatus are used, so that major new investments in equipment are not required to achieve the advantages of the invention.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for patterning a substrate, comprising the steps of:
    spin coating a first resist layer onto the substrate, the first resist layer comprising a solution of from about 6 to about 9 percent by volume of poly(methylmethacrylate) and a dye having an absorbance of at least about 1.2 at 436 nanometers light wavelength, the dye being present in a ratio of about 1 part dye to 4 parts poly(methylmethacrylate), by volume;
    baking the first resist layer, the amount of material deposited in said step of spin coating a first resist layer being sufficient that the thickness of the first resist layer after baking is from about 0.5 micrometers for about 6 percent poly(methylmethacrylate) to about 1.1 micrometers for about 9 percent poly(methylmethacrylate);
    spin coating a second resist layer overlying the first resist layer, the second resist layer being a positive photoresist material including a naphthoquinone diazide;
    baking the second resist layer, the amount of the material added in said step of spin coating a second resist layer being sufficient that the thickness of the second resist layer after baking is from about 0.4 at about 0.5 micrometers;
    exposing a pattern on the second resist layer with ultraviolet light having a wavelength of greater than about 300 nanometers, and developing the pattern to form an opening through the second resist layer; and
    exposing a pattern on the first resist layer with ultraviolet light having a wavelength of less than about 300 nanometers, through the opening in the second resist layer, removing the second resist layer, and developing the pattern to form an opening through the first resist layer, the width of the opening in the first layer being no greater than about 0.5 micrometers.

2. The process of claim 1, including the further step, after said step of exposing a pattern on the first resist layer, of
    depositing metal onto the structure and thence onto the substrate through the opening in the first resist layer.

3. The process of claim 2, including the further step, after said step of depositing metal, of
    removing the first resist layer.

4. The process of claim 1, wherein
    the thickness of the second resist layer, after baking, is about 0.46 micrometers,
    the second resist layer is exposed with ultraviolet light having a wavelength of about 436 nanometers, and
    the first resist layer is exposed with ultraviolet light having a wavelength of about 220 nanometers.

5. The process of claim 4, wherein
    the solution used in spin coating the first resist layer has about 9 percent poly(methylmethacrylate) and about 2.2 percent dye,
    the thickness of the first resist layer, after baking, is about 1.1 micrometers,
    the minimum width of the metal line is about 0.5 micrometers.

6. The process of claim 4, wherein
    the solution used in spin coating the first resist layer has about 6 percent poly(methylmethacrylate) and about 1.5 percent dye,
    the thickness of the first resist layer, after baking, is about 0.5 micrometers, and
    the minimum width of the metal line is less than about 0.5 micrometers.

* * * * *

UNITED STATES PATENT AND TRADEMARK OFFICE
CERTIFICATE OF CORRECTION

PATENT NO. : 4,906,552
DATED : March 6, 1990
INVENTOR(S) : CATHERINE M. NGO, et al.

It is certified that error appears in the above-identified patent and that said Letters Patent is hereby corrected as shown below:

Col. 8, line 8, delete "at" and insert --to--.

Signed and Sealed this

Eighth Day of August, 1995

Attest:

BRUCE LEHMAN

Attesting Officer    Commissioner of Patents and Trademarks